United States Patent [19]

Ghiraldi

[11] Patent Number: 4,907,644
[45] Date of Patent: Mar. 13, 1990

[54] METHOD AND CONTAINER DEVICE FOR THE PROTECTION AND THERMAL CONDITIONING OF APPARATUS, IN PARTICULAR ELECTRONIC APPARATUS GENERATING HEAT

[76] Inventor: Alberto Ghiraldi, Via Palatino 8, Milan, 20148, Italy

[21] Appl. No.: 184,603

[22] Filed: Apr. 21, 1988

[30] Foreign Application Priority Data

Apr. 21, 1987 [IT] Italy ............................ 20188 A/87

[51] Int. Cl.$^4$ ...................... F28D 15/00; H01L 23/46
[52] U.S. Cl. ................................. 165/32; 165/104.11; 165/104.33; 165/104.19; 165/104.34; 361/385
[58] Field of Search ...................... 165/104.11, 104.33, 165/32, 104.21, 104.19, 104.34; 361/385

[56] References Cited

U.S. PATENT DOCUMENTS

| 2,499,736 | 3/1950 | Kleen | 165/104.11 |
| 4,285,027 | 8/1981 | Mori et al. | 165/104.21 |
| 4,293,030 | 10/1981 | Rambach | 165/104.33 |

FOREIGN PATENT DOCUMENTS 37938   7/1978   Japan .............................. 165/104.19

Primary Examiner—Albert W. Davis, Jr.

[57] ABSTRACT

For the thermal conditioning of electronic apparatus generating heat, located in a container including one heat exchanger communicating between the outside and inside of the container, a length of this heat exchanger inside the ambient is immersed in a predetermined quantity of a material susceptible to a change of state at a temperature lower than that predetermined for the ambient relative to the correct functioning of the apparatus.

15 Claims, 4 Drawing Sheets

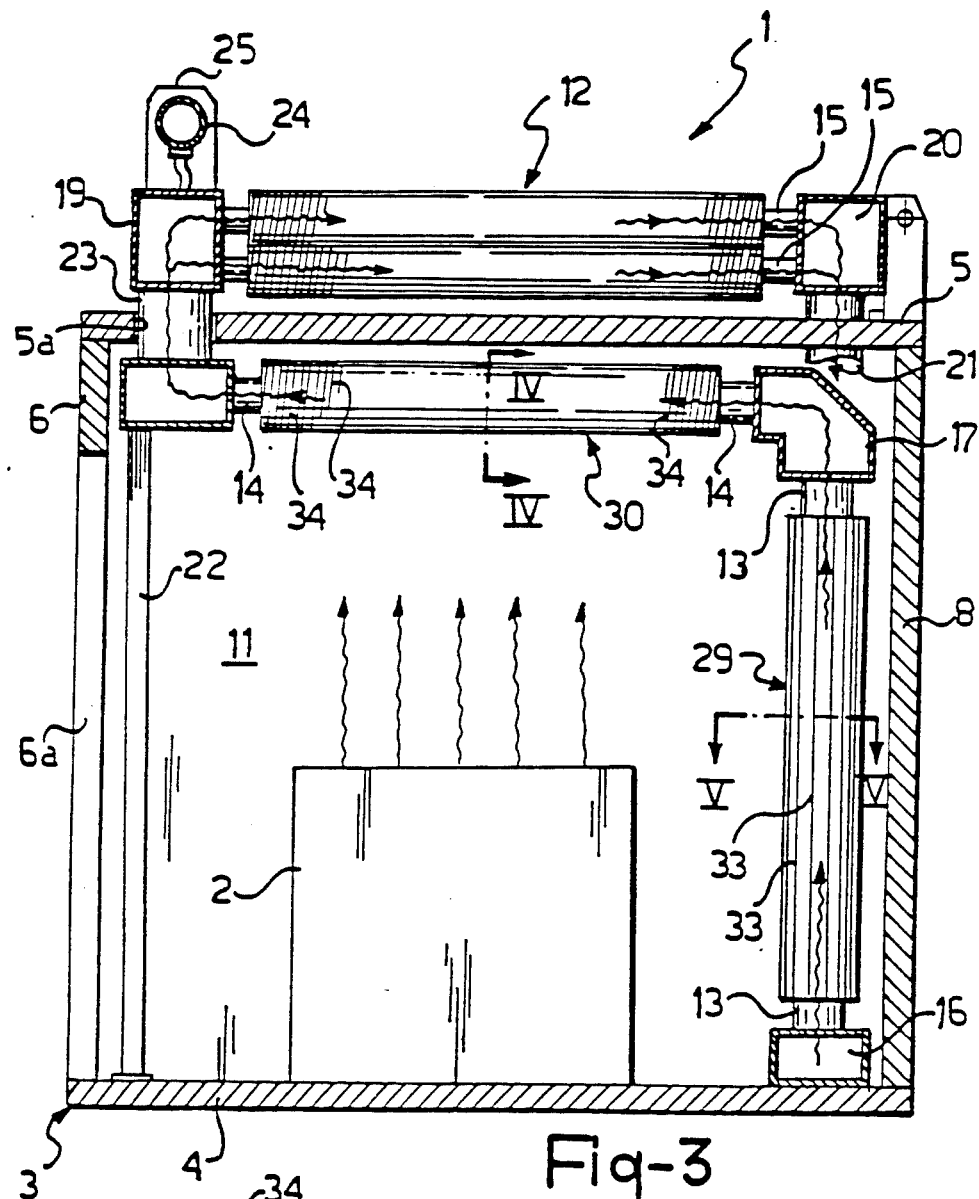
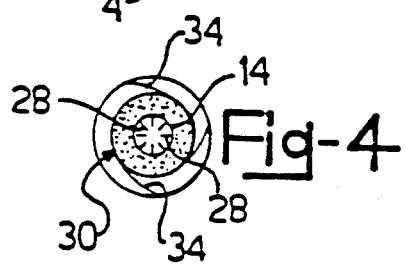
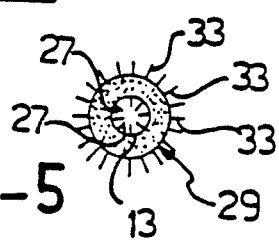
Fig-3
Fig-4
Fig-5

METHOD AND CONTAINER DEVICE FOR THE PROTECTION AND THERMAL CONDITIONING OF APPARATUS, IN PARTICULAR ELECTRONIC APPARATUS GENERATING HEAT

The present invention refers to a method for the thermal conditioning of apparatus, in particular electronic apparatus generating heat, located in a closed ambient of a container device inclusive of one heat exchanger extended for a length in said ambient with a thermal carrying fluid flowing through to remove excessive heat of the ambient.

In the zone where the electronic apparatus is installed, for example apparatus which may be a part of a telecommunications system, radar system, or remote centers for elaborating data, it is well known the necessity to protect this apparatus against atmospheric agents and to maintain the ambient in which it is placed at a temperature as near as possible constant and equal to the predetermined value established during the development of the project, and necessary for the correct functioning of the apparatus over lengthy periods of time.

To satisfy this above mentioned requirement, and in particular when the electronic apparatus must be installed in remote and isolated areas, and anyway when this apparatus does not require regular maintenance, the known systems generally use protective devices and thermal conditioning, better known by the English term "shelter".

These devices generally consist of a box shaped structure with insulated walls to limit the thermal exchange with the outside, also they include more or less complex systems for the removal of excess heat accumulated inside produced not only by the dissipated power of the electronic apparatus whilst functioning but also by periodic increases in the external ambient temperature.

In particular, recent methods of thermal conditioning with systems for the removal of heat, foresee the use of one or more heat exchangers containing a heat carrying fluid which dissipates the excess heat in the ambient in which is placed the electronic apparatus, by use of panels located outside the device. These heat exchangers are preferred to air conditioners and heat pumps as they are more reliable, no maintenance is necessary, and no power source is required, as the circulation of the heat carrying fluid occurs by natural convection.

Anyway, the conventional methods of the above type present major inconveniences as the temperature of the internal ambient in which is located the electronic apparatus depends in an unacceptable degree on the variations of the external temperature, both during the day and over a yearly period.

The fundamental problem to be resolved by this invention is to devise a method for the thermal conditioning of electronic apparatus which has characteristics that permit the surmounting of the inconveniences mentioned in the technical note.

This problem is resolved according to the invention of a method specified, characterized by the inclusion of the following steps:

Predispose in the said ambient a predetermined quantity of a material susceptible to a change in state at a lower temperature than a predetermined one for the said ambient;

Absorb with this said material the heat generated in the said ambient;

Impede the complete change of state of all of the quantity of material predisposed in said ambient by periodically subtracting the heat from it by the said heat carrying fluid predisposed in relation to the thermal exchange with the said quantity of material.

Ulterior characteristics and advantages of the method as per the invention are indicated in the following description of a shelter and an example of a method of implementation preferred, given as indicative only and not limited with reference to a container device illustrated in the attached drawings.

BRIEF DESCRIPTION OF THE DRAWINGS

FIG. 3 is a lateral view in section of the device in FIG. 1;

FIG. 4 and 5 are respectively detailed view of the device as per the invention in section according to the lines IV—IV and V—V of FIG. 3.

Figure 1:
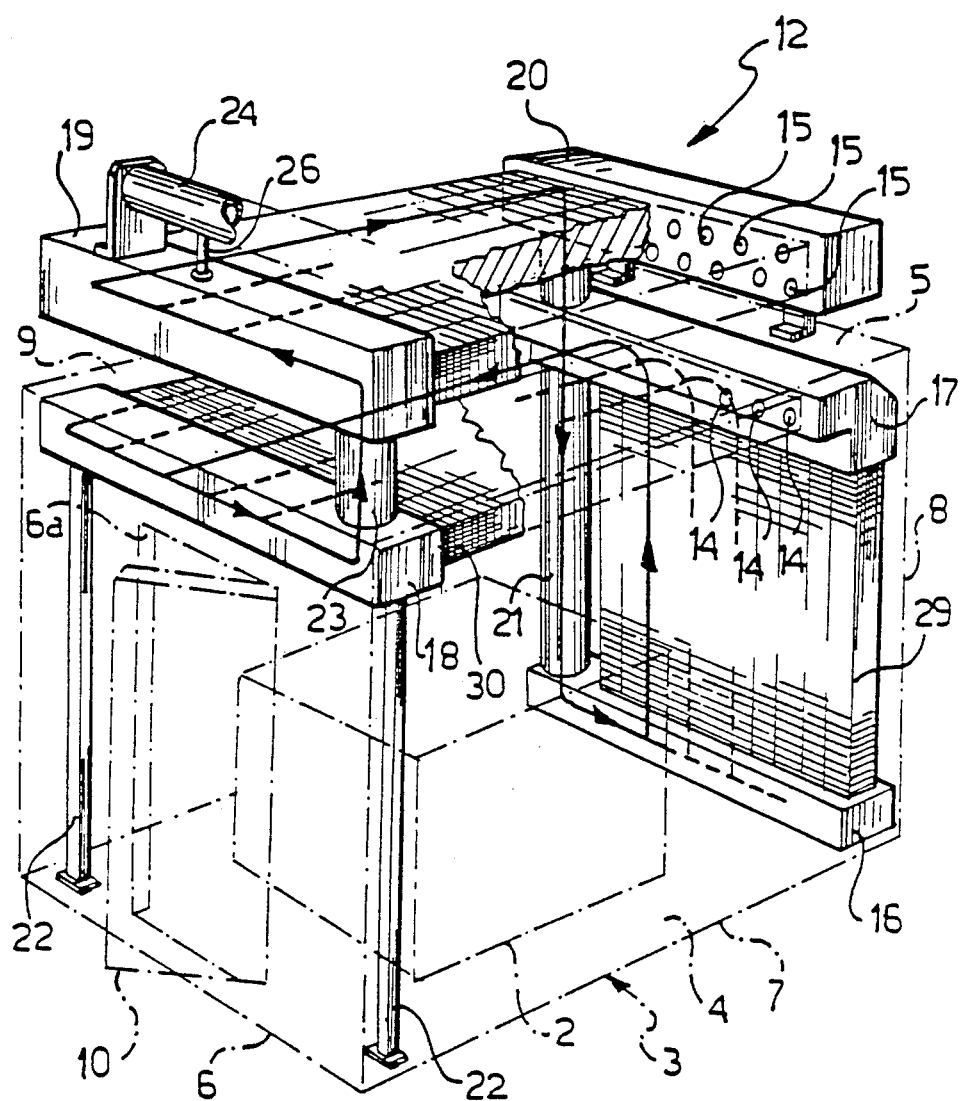
FIG. 1 is a perspective view and diagram of a container device for the implementation of a method of thermal conditioning as per the invention.

With reference to the above figures, in 1 is a container device, known as a "shelter", for the protection against atmospheric agents, and for thermal conditioning of an electronic apparatus 2 which is in itself conventional; in particular, the electronic apparatus 2 generates heat during its functioning.

The device 1 includes a closed box form structure, with a floor 4, a counterpositioned ceiling 5 and lateral walls 6,7,8, and 9. An opening 6a in the lateral wall 6 forming an entrance is closed by a door 10.

Advantageously, the ceiling 5 and the lateral walls 6-9 are insulated to limit thermal exchange with the outside.

In the box shaped structure 3 is defined an ambient 11, destined to hold the electronic apparatus 2.

The container device 1 includes also a heat exchanger, globally illustrated with 12, in which flows a heat carrying liquid permitting removal of the excess heat from the ambient 11 and dissipating it to the outside of the device 1. The heat exchanger 12 consists of a closed circuit in which the heat carrying fluid circulates by natural convection, and which is formed by a plurality of internal vertical conduits 13, a plurality of internal horizontal conduits 14 and 9 plurality of external conduits 15 sustained at the outside of the box form structure 3, by transverse collectors 16, 17, 18, 19 and 20 interposed between the said pluralities of conduits 13, 14 and 15 to permit circulation of the fluid, and also by a return pipe 21 for the heat carrying fluid connected with the external conduits 15 and the internal vertical conduits 13.

In the following description and for clarity, are used the expressions "downwards" and "upwards" and these are intended to refer to a preferred course of the heat carrying fluid in the heat exchanger 12, from the internal vertical conduits 13 to the internal horizontal conduits 14, and thereafter to the external conduits 15 and once again to the internal vertical conduits 13 through the return pipe 21.

Figure 2:
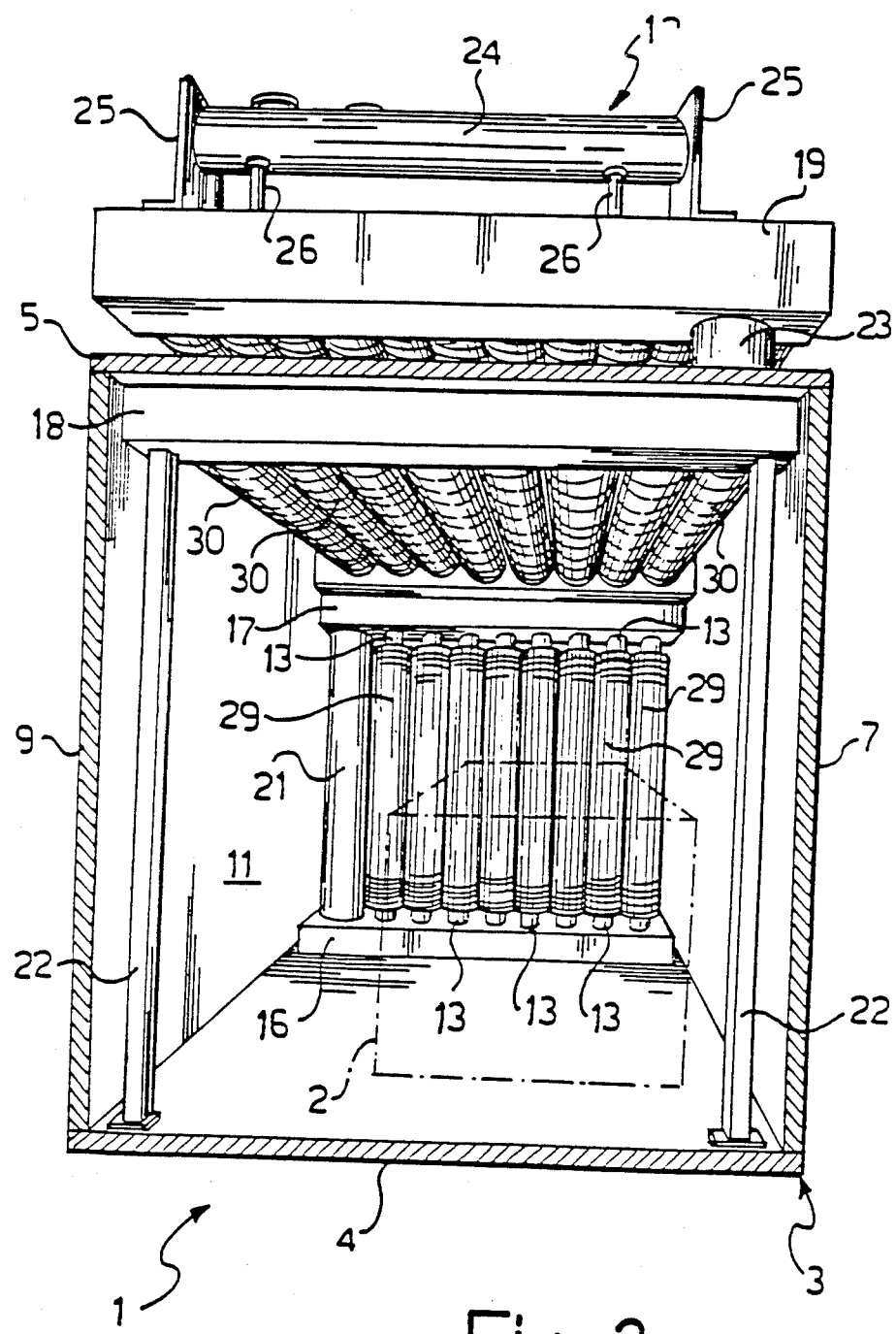
FIG. 2 is a perspective frontal view in partial section of the device in FIG. 1.
Figure 6:
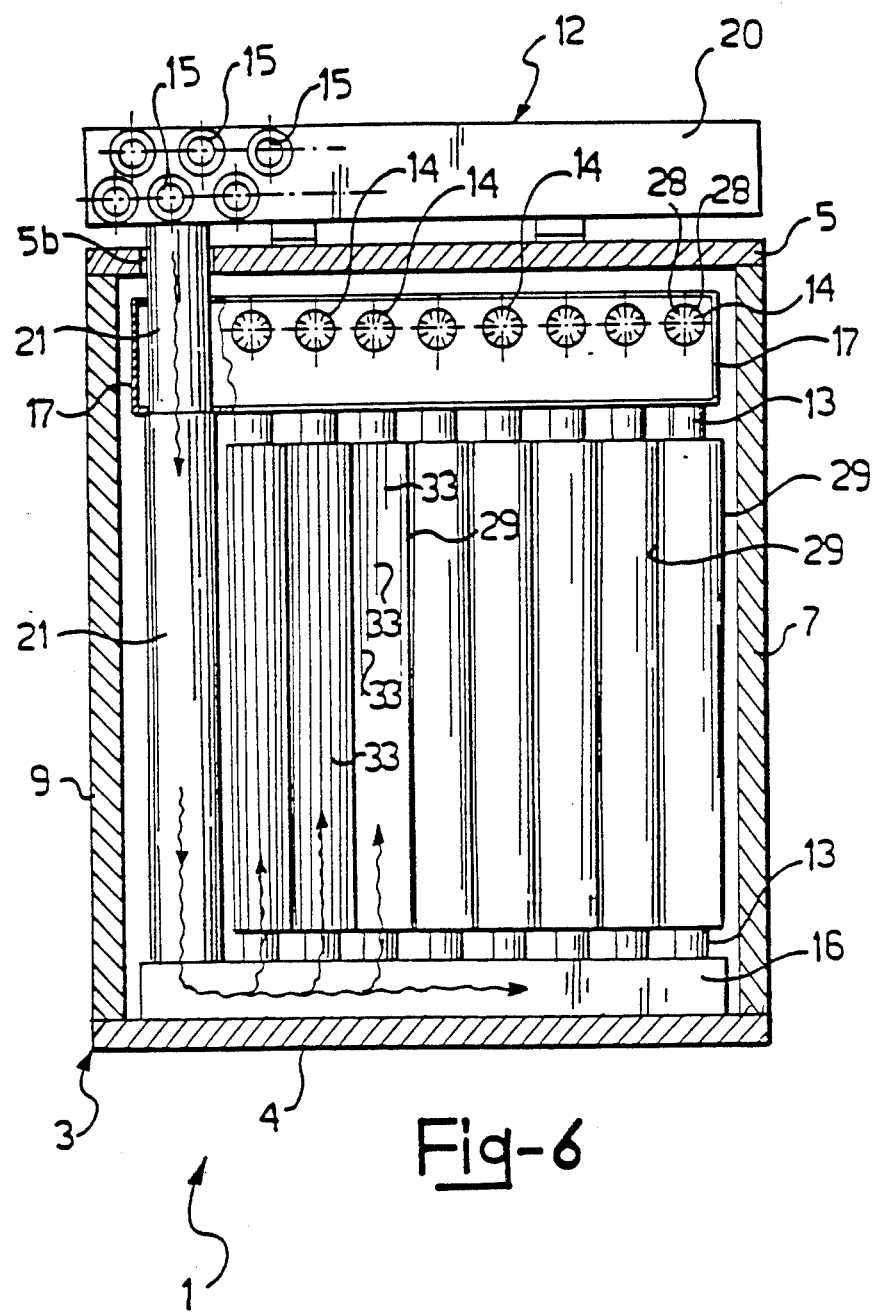
FIG. 6 is a frontal view in section of the device in FIG. 1

The internal vertical conduits 13, eight in the example illustrated in FIG. 2, are sustained in parallel relationship very near the lateral wall 8, opposite the opening 6a, and are in communication with the upward moving fluid by the first transversal manifold 16, and downward moving fluid with a second transverse manifold 17, and these manifolds are respectively supported close to the floor 4 and ceiling 5 of the box form structure 3.

The internal horizontal conduits 14, eight as per vertical conduits 13 are positioned near the ceiling 5, also in parallel relationship extending between and in connection with the fluid by the second manifold 17, upwards, and downwards with a third transverse manifold 18 which is sustained by two columns 22 near to the ceiling 5 and the lateral wall 6.

Advantageously the internal vertical conduits 13 and horizontal conduits 14 are internally furnished with fins, respectively 27 and 28 as shown in FIGS. 4 and 5, extending longitudinally in these conduits.

The third manifold 18 is connected to a fourth transverse manifold 19, supported outside the box form structure 3 near the ceiling 5, by a vertical pipe 23 extended through a corresponding opening 5a made in the ceiling 5.

24 is an expansion tank consisting of a horizontal cylinder extended along the fourth manifold 19, and fixed by counter flanges and in contact with the fluid by two vertical pipes 26 of small diameter. The external conduits 15 are externally finned and positioned in two horizontal rows offset one near the other so as to constitute a kind of radiating panel extended near the ceiling 5. The conduits 15 are upwards connected with the fourth manifold 19, and downwards connected with a fifth transverse manifold 20, supported on the outside of the box form structure 3 in a position above the second manifold 17.

The return pipe 21 of the heat carrying fluid is extended through a corresponding opening 5b made in the ceiling 5 and through the second manifold 17, and upwards connected with the fifth manifold 20 and downwards connected with the first manifold 16. Furthermore, the length of the piping 21 extended in the ambient 11 is insulated.

The container device 1 also includes a plurality of cylindrical housings 29 and 30, placed over the respective internal vertical conduits 13 and horizontal conduits 14, and closed around them in a way so that between each housing 29 (or 30) and the corresponding conduit 13 (14) there is an annular area 31 (32).

In conformance to the present invention, in the areas 31 and 32 there is contained a predetermined quantity of a material M susceptible to a change of state at a temperature T lower than a temperature TA predetermined for the said ambient 11 in relation to the correct functioning of the electronic apparatus 2.

According to a preferred form of practicing the invention, with a temperature TA of about 35°C., the said material M is a mixture of normal paraffin C-18 which melts at a temperature of about 27°C. It is important to note that the internal vertical conduits 13 and internal horizontal conduits 14 are nearly completely covered by the respective housing 29 and 30, and therefore are surrounded in the mixture of paraffin for a major proportion of their lengths.

Advantageously the housings 29 are externally provided with longitudinal fins 33, to increase the thermal exchange surface with the ambient 11.

Preferably, the housings 30 are externally provided with helical fins 34. Other fin arrangement may be used.

Furthermore, the container device 1 foresees the use of conventional valves, and therefore not illustrated, placed in the conduits 13, 14 and 15 which act on the heat carrying fluid and allow it to move in only one direction through the circuit.

The following description is of a method as per the invention for the thermal conditioning of apparatus, in particular electronic apparatus generating heat, applied by the device 1 described previously.

The method as per the invention, in an initial phase, foresees the predisposal in ambient 11 of a predetermined amount of material M susceptible to a change of state at a temperature, T lower than a temperature TA predetermined for the ambient and relative to a maximum permissible temperature for the correct functioning of the electronic apparatus 2.

The method includes the steps of absorbing in this material M heat generated in the ambient 11, and impeding the complete changing of state of all the quantity of material M by periodically subtracting heat from the ambient 11 by the thermal carrying fluid predisposed in relation to the thermal exchange with the said quantity of material M in the internal vertical conduits 13 and horizontal ones 14.

As a consequence, this is equivalent to inserting between the ambient 11 and the heat carrying fluid of the heat exchanger 12, which is designed to remove the excess heat in the ambient, a material which accumulates this heat utilizing it to change it's state, and therefore, as noted, maintaining itself at a temperature substantially constant. It is important to note that to avoid excessive increases in the temperature, it is necessary to impede the complete change of state of all the quantity of material M. For this reason the quantity of material M is predetermined in a way so that the change of state, which is verified during the hottest hours of the day when the temperature outside the device 1 is higher than the temperature T and the heat carrying fluid does not remove the heat to the outside, is still not completed.

For example, during the night hours the temperature outside the device 1 is lower than the temperature T. As soon as this happens the circulating by natural convection of the heat carrying fluid begins in the heat exchanger 12 and it is then possible to remove the excess heat accumulated in the quantity of material M.

As such, this material M has been especially chosen as a mixture of normal paraffin whose performance in terms of change from a solid state to a liquid state and vice-versa is particularly suitable to maintain the internal ambient of the container device at a temperature substantially constant and in practice independent from the temperature variations of the external ambient as required for the correct functioning of the electronic apparatus.

The container device for implementing the method according to the invention has the principle advantage of a notable structural simplicity, and in particular regarding the heat exchanger in which the thermal carrying fluid flows by natural circulation. Furthermore the above described container device 1 does not call for any normal maintenance and therefore it is to be considered that its functioning is reliable over a lengthy period of time.

A further advantage of the device in conformance to the invention is that it offers an ample range of use, not only for the type of apparatus in which it may be contained, but also for the external climatic conditions. In fact this device may be used in the most various circumstances varying the quantity or the type of mixture of paraffin contained between the housings and the internal conduits, chosing an adequate thermal carrying fluid, and appropriately dimensioning the conduits and relative fins.

For the implementation indicated above the method and the container device are obviously susceptible to variations and modifications all however within the range of protection of the invention which is defined by the following claims:

I claim:

1. A device for the protection and thermal conditioning of apparatus such as electronic apparatus generating heat, comprising a box-shaped structure in which is defined an ambient adapted to hold the apparatus and a heat exchanger in which flows a thermal carrying fluid adapted to absorb heat within said ambient and dissipate heat outside of said ambient and which includes at least one conduit extending in the said ambient, and at least one housing over the said at least one conduit forming an annular space between the said housing and said conduit and predetermined quantity of material contained in the said annular space, said material being susceptible to a change of state at a temperature which is lower than a temperature which is related to a maximum predetermined temperature for the said ambient predetermined for the operation of said apparatus, said box-shaped structure comprising insulated lateral walls and an insulated ceiling, said heat exchanger comprising (i) a plurality of internal vertical conduits and a corresponding plurality of internal horizontal conduits extending in the said ambient and supported respectively in close proximity to one of the said lateral walls and said ceiling, (ii) a plurality of external conduits supported by the box-shaped structure outside the said ambient, and (iii) connecting means interconnecting all of said conduits to form said heat exchanger and permit the flow of a thermal carrying fluid therein by natural convection.

2. The deviee of claim 1, characterized by the fact that the said internal vertical conduits and internal horizontal conduits are internally furnished with fins extending longitudinally to the conduits.

3. The device according to claim 1, characterized by the fact that around each of the said internal vertical conduits and internal horizontal conduits there are respectively placed closed housing.

4. A device according to claim 3, characterized by the fact that the said internal vertical conduits and internal horizontal conduits are immersed in the said material for a major portion of their length.

5. A device according to claim 3, characterized by the fact that the said housings around the internal vertical conduits and the internal horizontal conduits are provided externally with fins which are longitudinal and helical respectively.

6. A device according to claim 1, characterized by the fact that the said thermal carrying fluid circulates in the said heat exchanger solely by natural convection.

7. A shelter for a heat generating apparatus adapted to maintain an ambient in a predetermined temperature range, said shelter consisting of a container having an interior and an exterior and a heat transport system comprising a heat dissipating apparatus exterior of said container fluidically connected in two locations to heat absorbing apparatus interior of said container, said heat dissipating apparatus and said heat absorbing apparatus containing a heat conducting fluid adapted to absorb heat from the interior of said shelter and dissipate heat to the exterior of said shelter while remaining substantially in the liquid phase and moving solely by natural convection, said heat absorbing apparatus further characterized by having a substantially horizontal portion in close proximity to the upper surface of said interior of said container and a substantially vertical portion fluidically connected thereto extending a substantial distance downwardly from said horizontal portion, said heat absorbing apparatus comprising conduits for said heat conducting fluid said conduits being surrounded along a substantial portion of their length by a material adapted to absorb heat from the interior of said shelter and characterized by the fact that it at least partially melts at a temperature within said predetermined temperature range.

8. A device for the protection and thermal conditioning of apparatus such as electronic apparatus which generates heat, comprising a box-shaped structure in which is defined an ambient adapted to hold the apparatus and a heat exchanger which is substantially filled with a thermal carrying liquid adapted to absorb heat within said ambient and dissipate heat outside of said ambient solely by means of natural convection; said box-shaped structure having lateral walls and a ceiling, said heat exchanger comprising (i) an internal portion comprising a plurality of vertical conduits and a corresponding plurality of horizontal conduits extending in said ambient and supported respectively in one of the said lateral walls and said ceiling, (ii) an external portion comprising a plurality of external conduits supported by the box-shaped structure outside the said ambient, and (iii) connecting means interconnecting all of said conduits to form said heat exchanger and permit the flow of said thermal carrying liquid therein by natural convection, at least one housing over part of the conduits forming said internal portion of said heat exchanger and forming an annular space between said housing and said part of said conduits forming said internal portion of said heat exchanger and a predetermined quantity of material contained in the said annular space, said material being susceptible to a change of state at a temperature lower than a maximum ambient temperature predetermined for the operation of the apparatus, said material being adapted to transfer heat to said thermal carrying liquid in said part of said conduits forming said internal portion of said heat exchanger.

9. Thermal conditioning apparatus comprising an electronic apparatus which generates heat, a box-shaped structure in which is defined an ambient to hold said electronic apparatus and a heat exchanger in which is defined an ambient adapted to hold the apparatus and a heat exchanger which is substantially filled with a thermal carrying liquid adapted to absorb heat within said ambient and dissipate heat outside of said ambient solely by means of natural convection; said box-shaped structure having lateral walls and a ceiling, said heat exchanger comprising (i) an internal portion comprising a plurality of vertical conduits and a corresponding plurality of horizontal conduits extending in said ambient and supported respectively in one of the said lateral walls and said ceiling, (ii) an external portion comprising a plurality of external conduits supported by the box-shaped structure outside the said ambient, and (iii) connecting means interconnecting all of said conduits to form said heat exchanger and permit the flow of said thermal carrying liquid therein by natural convection, at least one housing over part of the conduits forming said internal portion of said heat exchanger and forming an annular space between said housing and said part of said conduits forming said internal portion of said heat exchanger and a predetermined quantity of material contained in the said annular space, said material being susceptible to a change of state at a temperature lower than a maximum ambient temperature predetermined for the operation of the apparatus, said material being adapted to transfer heat to said thermal carrying liquid in said part of said conduits forming said internal portion of said heat exchanger.

10. Thermal conditioning apparatus comprising electronic apparatus which generates heat, a box-shaped structure in which is defined an ambient adapted to hold the electronic apparatus and a heat exchanger in which flows a thermal carrying fluid adapted to absorb heat within said ambient and dissipate heat outside of said ambient and which includes at least one conduit extending in the said ambient; and at least one housing over the said at least one conduit forming an annular space between the said housing and said conduit and a predetermined quantity of material contained in the said annular space, said material being susceptible to a change of state at a temperature which is lower than a temperature which is related to a maximum predetermined temperature for the said ambient predetermined for the operation of said apparatus, said box-shaped structure comprising insulated lateral walls and an insulated ceiling, said heat exchanger comprising (i) a plurality of internal vertical conduits and a corresponding plurality of internal horizontal conduits extending in the said ambient and supported respectively in close proximity to one of the said lateral walls and said ceiling, (ii) a plurality of external conduits supported by the box-shaped structure outside the said ambient, and (iii) connecting means interconnecting all of said conduits to form said heat exchanger and permit the flow of a thermal carrying fluid therein by natural convection.

11. The apparatus of claim 10, characterized by the fact that the said internal vertical conduits and internal horizontal conduits are internally furnished with fins extending longitudinally to the conduits.

12. The apparatus of claim 10, characterized by the fact that around each of the said internal vertical conduits and internal horizontal conduits there are respectively placed closed housings.

13. The apparatus of claim 12, characterized by the fact that the said internal vertical conduits and internal horizontal conduits are immersed in the said material for a major portion of their length.

14. The apparatus of claim 12, characterized by the fact that the said housings around the internal vertical conduits and the internal horizontal conduits are provided externally with fins, which are longitudinal and helical respectively.

15. The apparatus of claim 10, characterized by the fact that the said thermal carrying fluid circulates in the said heat exchanger solely by natural convection.

* * * * *